United States Patent [19]

Burkes et al.

[11] Patent Number: 5,651,133

[45] Date of Patent: Jul. 22, 1997

[54] METHODS FOR AVOIDING OVER-COMMITMENT OF VIRTUAL CAPACITY IN A REDUNDANT HIERARCHIC DATA STORAGE SYSTEM

[75] Inventors: Theresa A. Burkes, Meridian; Bryan M. Diamond; Marvin D. Nelson, both of Boise, all of Id.

[73] Assignee: Hewlett-Packard Company, Palo Alto, Calif.

[21] Appl. No.: 382,350

[22] Filed: Feb. 1, 1995

[51] Int. Cl.$^6$ .................................................. G06G 12/16
[52] U.S. Cl. ................................. 395/441; 395/182.04
[58] Field of Search ........................... 395/441, 182.04, 395/182.05, 416, 417; 371/10.1, 10.2

[56] References Cited

U.S. PATENT DOCUMENTS

| | | | |
|---|---|---|---|
| 5,155,835 | 10/1992 | Belsan | 395/441 |
| 5,195,100 | 3/1993 | Katz et al. | 395/182.2 |
| 5,237,658 | 8/1993 | Walker et al. | 395/858 |
| 5,278,838 | 1/1994 | Ng et al. | 395/182.04 |
| 5,287,462 | 2/1994 | Jibbe et al. | 395/856 |
| 5,289,418 | 2/1994 | Youngerth | 365/201 |
| 5,297,258 | 3/1994 | Hale et al. | 395/441 |
| 5,392,244 | 2/1995 | Jacobson et al. | 395/441 |
| 5,479,653 | 12/1995 | Jones | 395/182 |
| 5,485,571 | 1/1996 | Menon | 395/182.05 |
| 5,491,810 | 2/1996 | Allen | 395/444 |
| 5,519,844 | 5/1996 | Stallmo | 395/441 |
| 5,568,629 | 10/1996 | Gentry et al. | 395/441 |
| 5,574,851 | 11/1996 | Rathunde | 395/182.05 |
| 5,579,475 | 11/1996 | Blaum et al. | 395/182.05 |
| 5,590,276 | 12/1996 | Andrews | 395/182.04 |
| 5,592,648 | 1/1997 | Schultz et al. | 395/441 |
| 5,596,709 | 1/1997 | Bond et al. | 395/182.05 |

Primary Examiner—Tod R. Swann
Assistant Examiner—Keith W. Saunders

[57] ABSTRACT

A hierarchic disk array data storage system has a disk array with multiple storage disks and a disk array controller which coordinates data transfer to and from the disks. The storage disks define a physical storage space. A RAID management system maps a RAID-level virtual storage space onto the physical storage space. The RAID-level virtual storage space presents the physical storage space as multiple RAID areas. The RAID areas include mirror RAID areas which contain mirror allocation blocks to store data according to mirror redundancy and parity RAID areas which contain parity allocation blocks to store data according to parity redundancy. The RAID management system dynamically migrates data between the mirror and parity RAID areas in a manner which optimizes performance and data reliability. As new storage requests are made, the RAID management system evaluates the existing storage conditions and computes a total virtual capacity that is available to the user given a disk array configuration. A total virtual capacity can be calculated without including the capacity of any given storage disk in the disk array data storage system. The total virtual capacity calculation is used to support hot spare space reservation, disk removal, rebuild of a failed disk, and to prevent over-commitment of storage to user data.

23 Claims, 8 Drawing Sheets

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T-1 | T-1' | T | T' | S |

FIG. 2

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R-2 | R-1 | R | Q |

FIG. 3

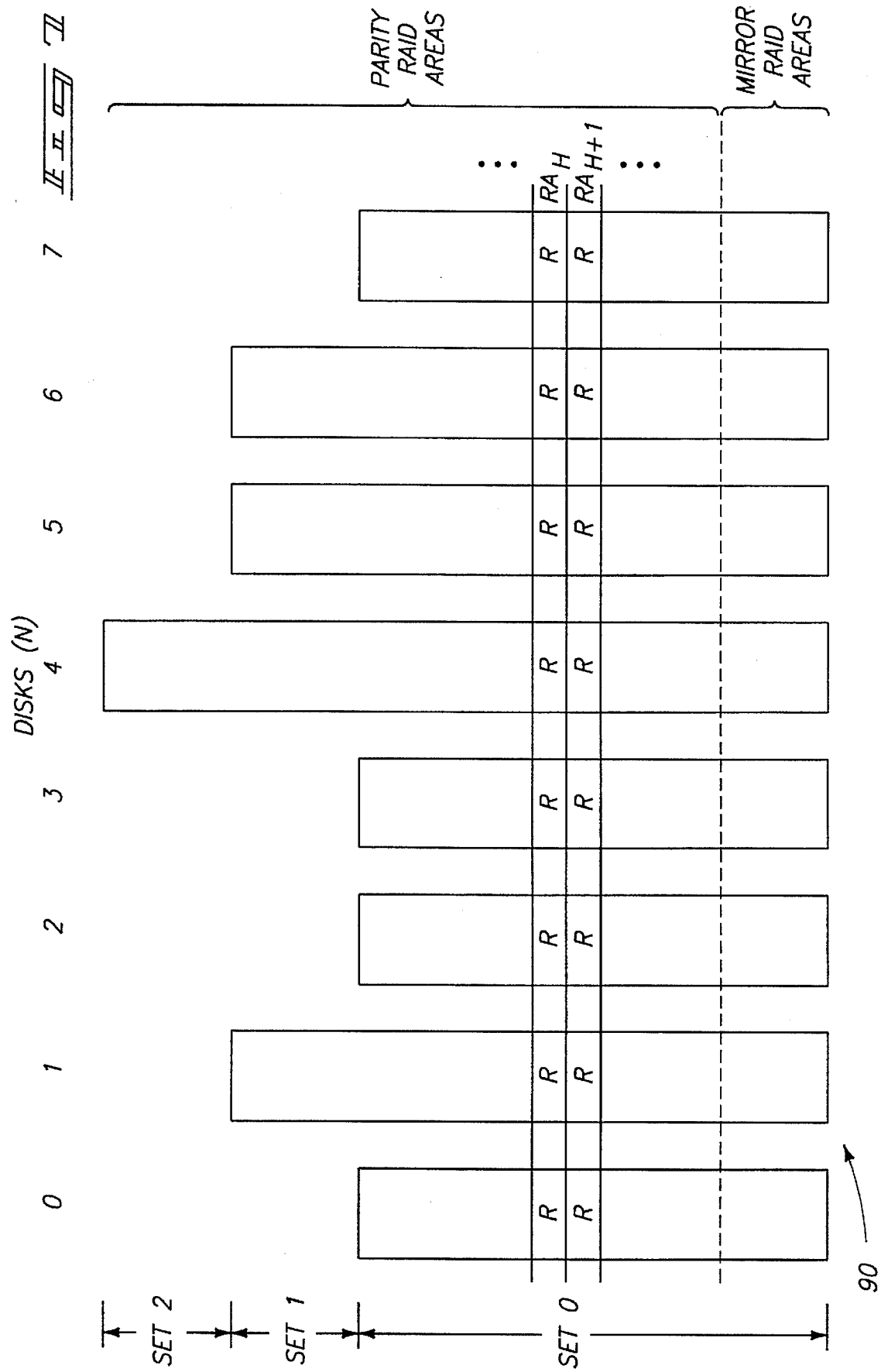

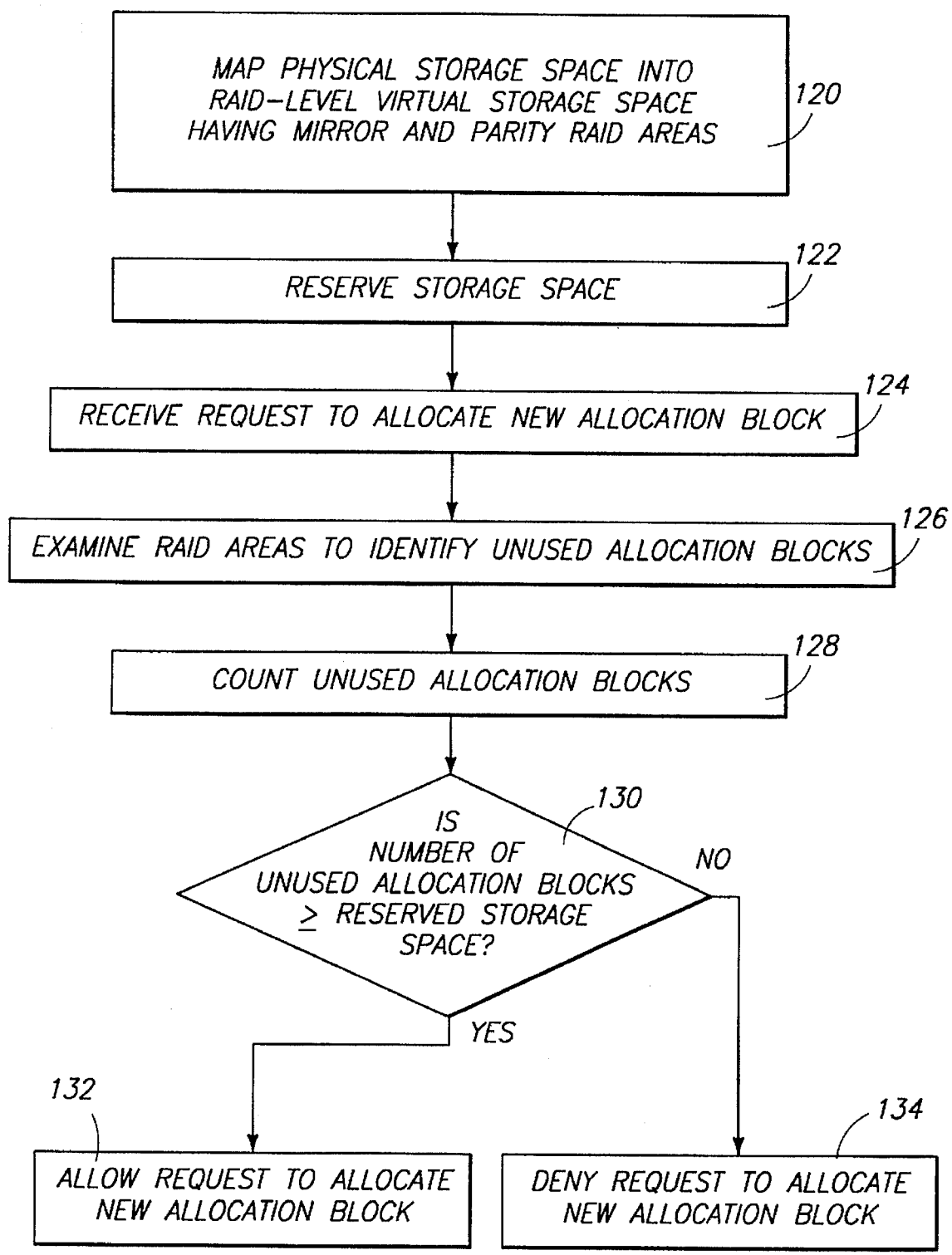

METHODS FOR AVOIDING OVER-COMMITMENT OF VIRTUAL CAPACITY IN A REDUNDANT HIERARCHIC DATA STORAGE SYSTEM

FIELD OF THE INVENTION

This invention relates to methods for avoiding over-commitment of virtual storage space in a redundant hierarchic data storage system. This invention also relates to hierarchic data storage system themselves.

BACKGROUND OF THE INVENTION

Computer systems are constantly improving in terms of speed, reliability, and processing capability. As a result, computers are able to handle more complex and sophisticated applications. As computers improve, performance demands placed on mass storage and input/output (I/O) devices increase. There is a continuing need to design mass storage systems that keep pace in terms of performance with evolving computer systems.

This invention particularly concerns the mass storage systems of the disk array type. A Disk array data storage system has multiple storage disk drive devices which are arranged and coordinated to form a single mass storage system. There are three primary design criteria for mass storage systems: cost, performance, and availability. It is most desirable to produce memory devices that have a low cost per megabyte, a high input/output performance, and high data availability. "Availability" is the ability to access data stored in the storage system and the ability to insure continued operation in the event of some failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

SUMMARY OF THE INVENTION

This invention provides a redundant hierarchic data storage system that stores data according to different redundant techniques to optimize performance and reliability. The invention is primarily directed to methods for avoiding over-commitment of virtual storage space available to the user.

The data storage system includes a disk array having a plurality of storage disks and a disk array controller which coordinates data transfer to and from the disks. The storage disks define a physical storage space. The data storage system has a RAID (Redundant Array of Independent Disks) management system operatively coupled to the disk array controller for mapping a RAID-level virtual storage space onto the physical storage space of the storage disks. The RAID-level virtual storage space presents the physical storage space as multiple RAID areas, where individual RAID areas extend across multiple storage disks. The RAID areas include mirror RAID areas which contain mirror allocation blocks to store data according to mirror redundancy and parity RAID areas which contain parity allocation blocks to store data according to parity redundancy. A memory map store is operatively coupled to the RAID management system to persistently store mapping information used by the RAID management system to map the RAID-level virtual storage space onto the disks within the disk array. The RAID management system dynamically migrates data between the mirror and parity RAID areas in a manner which optimizes performance and data reliability. A certain amount of RAID-level virtual storage space is reserved or set aside for this migration.

To avoid over-committing the RAID-level virtual storage space, the RAID management system computes a total virtual capacity which can be used as a reference for future storage requests. This computation is based on a theoretical worst case arrangement of the mirror and parity storage areas. The RAID management system first provides for a minimum percentage of user data to be kept in mirror storage areas and for the remaining percentage of user data to be kept in parity storage areas. The total virtual capacity of the application-level virtual storage space that can be committed to a user is computed based upon provision for the minimum percentage of user data to be kept in mirror RAID areas and the remaining percentage of user data to be kept in parity RAID areas. This total virtual capacity is referenced when additional storage requests of the system are made to determine whether the requests can be allowed without over-committing virtual storage space.

The RAID management system is also designed to evaluate quickly whether a new storage request can be accommodated without resorting to space management techniques such as migrating data between mirror and parity storage to free up space for the new storage request. This evaluation is done by examining individual RAID areas to identify any unused allocation blocks and counting the number of unused allocation blocks. The request to allocate a new allocation block is allowed if the number of unused allocation blocks is greater than or equal to the reserved storage space that is set aside for migration.

DESCRIPTION OF THE DRAWINGS

Preferred embodiments of the invention are described below with reference to the following accompanying drawings depicting examples embodying the best mode for practicing the invention.

FIG. 2 is a diagrammatic illustration of storage space on multiple storage disks and shows data storage according RAID Level 1.

FIG. 3 is a diagrammatic illustration of storage space on multiple storage disks and shows data storage according RAID Level 5.

FIG. 7 is a diagrammatic illustration of storage space on multiple storage disks and shows the operation of the method in FIG. 5.

FIG. 9 is a flow diagram of a method for operating a redundant hierarchic disk array when handling storage requests according to yet another aspect of this invention.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Figure 1:
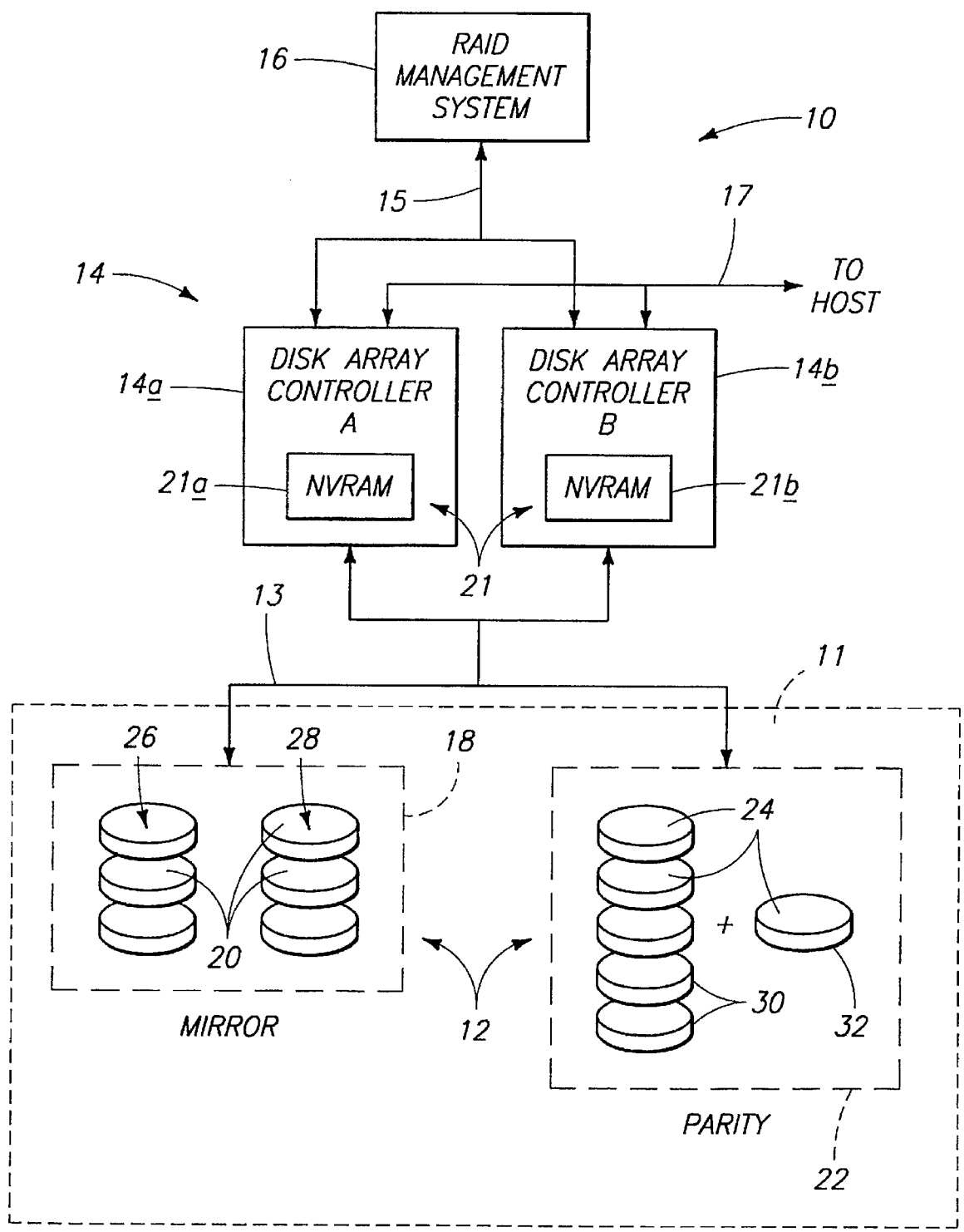
FIG. 1 is a diagrammatic block diagram of a redundant hierarchic disk array data storage system according to this invention.

FIG. 1 shows a data storage system 10 constructed according to PROMs (Programmable Read Only Memories), EPROMs (Erasable Programmable Read Only Memories), and EEPROMs (Electrically Erasable Programmable Read Only Memories)). The term "disk array" means a collection of disks, system which includes a hierarchic disk array 11 having a plurality of storage disks 12, a disk array controller 14 coupled to the disk array 11 to coordinate data transfer to and from the storage disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, The RAIDBook: A Source Book for RAID Technology, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14 or within the host computer to provide a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. Dual controllers 14a and 14b enhance reliability by providing continuous backup and redundancy in the event that one controller becomes inoperable. This invention can be practiced, however, with a single controller or other architectures.

The hierarchic disk array 11 can be characterized as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Data storage system 10 includes a memory map store 21 that provides for persistent storage of the virtual mapping information used to map different storage spaces into one another. The memory map store is external to the disk array, and preferably resident in the disk array controller 14. The memory mapping information can be continually or periodically updated by the controller or RAID management system as the various mapping configurations among the different views change.

Preferably, the memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the data storage system 10. One preferred construction is a self-refreshing, battery-backed DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, disk array 11 has multiple storage disk drive devices 12. Example sizes of these storage disks are one to three Gigabytes. The storage disks can be independently connected or disconnected to mechanical bays that provide interfacing with SCSI bus 13. In one implementation, the data storage system is designed with twelve active mechanical bays. Four SCSI buses are used to interface these bays with disk array controller 14 (i.e., one bus per three mechanical bays). If the active bays are fully loaded, the data storage system has an example combined capacity of 12–36 Gigabytes. Disk array controller 14 recognizes storage disks 12 regardless into which bay they are plugged. The data storage system 10 is designed to permit "hot plug" of additional disks into available mechanical bays in the disk array while the disk array is in operation.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "$\oplus$". The parities for the first four stripes (with the subscript numeral representing the corresponding stripe) are as follows:

| | |
|---|---|
| $P_0$ | = Segment 0 $\oplus$ Segment 1 $\oplus$ Segment 2 |
| | = Disk 0 $\oplus$ Disk 1 $\oplus$ Disk 2 |
| $P_1$ | = Segment 3 $\oplus$ Segment 4 $\oplus$ Segment 5 |
| | = Disk 0 $\oplus$ Disk 1 $\oplus$ Disk 3 |
| $P_2$ | = Segment 6 $\oplus$ Segment 7 $\oplus$ Segment 8 |
| | = Disk 0 $\oplus$ Disk 2 $\oplus$ Disk 3 |
| $P_3$ | = Segment 9 $\oplus$ Segment 10 $\oplus$ Segment 11 |
| | = Disk 1 $\oplus$ Disk 2 $\oplus$ Disk 3 |

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. The regions are grouped together to form RAID areas in one virtual view of the storage space. Additionally, another (host-defined) view of storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 tries to place the more performance-critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently accessed data is maintained in the mirror RAID area 18 while the less recently accessed data is stored in parity RAID area 22. Other performance protocols may be employed. Ideally, such protocols are defined based upon the specific computer application and the needs of the user.

Additionally, the RAID management system 16 automatically "tunes" the storage resources of a data storage system according to a function of two parameters: size of the physical storage capacity and size of the present amount of user data being stored in the data storage system. Initially, all data is stored in mirror RAID areas because this affords the highest performance and reliability. As more data is added to the data storage system, the data is migrated between mirror RAID areas and parity RAID areas to optimize performance and reliability. As the data storage system approaches full capacity, more and more data is migrated to parity RAID areas in an effort to meet all demands by the user while still providing reliability through redundancy. Accordingly, the data storage system of this invention affords maximum flexibility and adaptation. It does not require the user to select a specific storage regime, but instead can adapt to any demand placed on it by the user.

Figure 4:
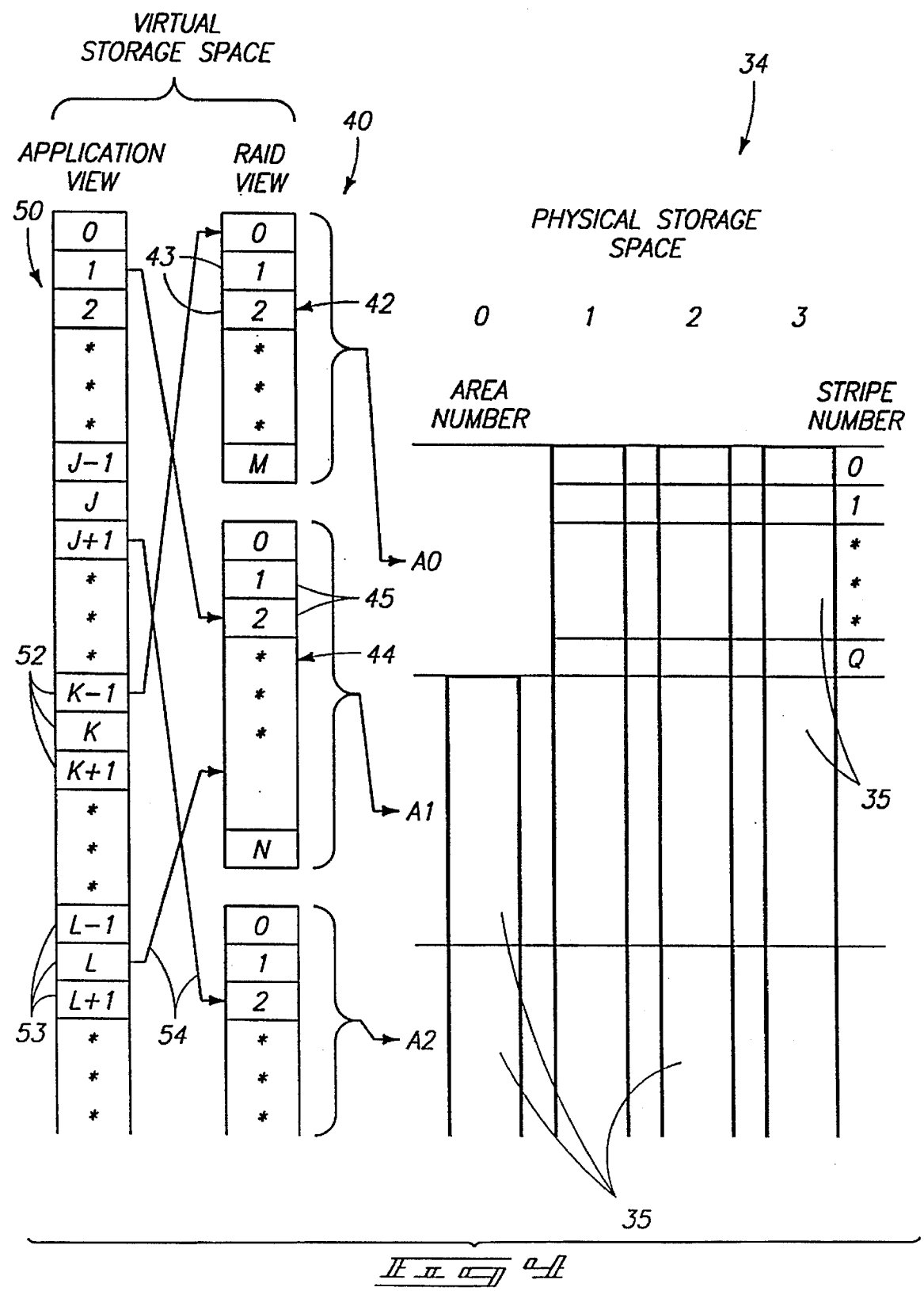
FIG. 4 is a diagrammatic illustration of a memory mapping arrangement of this invention where two virtual storage spaces are mapped onto a physical storage space.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. Example storage capacities for such disks are 1–3 Gigabytes. The storage space 34 is partitioned into areas A0, A1, A2, etc. Individual areas contain numerous stripes, such as stripes 0—0 in area A0. Individual areas also contain numerous regions 35. Regions 35 preferably consist of a selected number of uniform sized segments on every storage disk so that the regions are equal in size across the entire disk array. An example size of one region 35 is one Megabyte.

The storage space of the disks are mapped into a first, intermediate, RAID-level virtual view 40 of the physical storage space 34. This first virtual view is conceptually a set of RAID areas which can be mapped to a second application view that represents a contiguously addressable storage space. The physical configuration and RAID views of the storage space are hidden from the application view.

The RAID area storage space 40 is the view of storage that identifies the mirror and parity storage space. For instance, a RAID area 42 may represent a mirror RAID area of M allocation blocks 43 while RAID area 44 may represent a parity RAID area of N allocation blocks 45. The allocation blocks 43 and 45 are preferably equal sized, with an example size being 64 Kilobytes. These RAID areas relate to corresponding physical areas A0, A1, A2, etc., on the physical storage space 34. As an example, sixteen 64K allocation blocks 43 or 45 at the RAID virtual view can be mapped onto a single 1M region 35.

The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area. It is also noted that the RAID areas are shown as being mapped into contiguous areas on the disk array, where each region associated with a RAID area is located at the same physical address on each storage disk. The RAID areas may alternatively be mapped into non-contiguous areas on the disk array as well.

The storage space available in the RAID areas is mapped into a second, front end, application-level virtual view 50 which is a view of storage as defined by and presented to the user or host application program. When viewed by the user or host application program, the application-level virtual view 50 can represent a single large storage capacity indicative of the available storage space on storage disks 12. Virtual storage space 50 presents a view of a linear set of equal sized storage virtual blocks 52 and 53, referenced individually as 0, 1, 2 . . . J–1, J, J+1 . . . L–1, L, L+1 . . . etc. Virtual blocks 52 and 53 are preferably the same size as the allocation blocks in RAID area 40, with an example size being 64 Kilobytes. The virtual block storage space 50 is represented by a table of references or pointers (as represented by arrows 54*) to allocation blocks in the view presented by RAID areas 40. Virtual blocks 52 and 53 at the application virtual view 50 are therefore associated with allocation blocks 43 and 45 at the RAID virtual view 40 via the pointers maintained in the virtual block table. There are at least two types of RAID areas that can be referenced from the virtual block table: mirror and parity.

The RAID management system 16 can dynamically alter the configuration of the RAID areas over the physical storage space. The number of RAID areas for each type may be increased or decreased depending upon the amount of user data being stored in the system and the size of the physical disk storage space. As a result, the mapping of the RAID areas in the RAID-level virtual view 40 onto the disks and the mapping of the application-level virtual view 50 to RAID view 40 are generally in a state of change. The memory map store in NVRAMs 21a and 21b (FIG. 1) maintains the current mapping information used by RAID management system 16 to map the RAID areas onto the disks, as well as the information employed to map between the two virtual views. As the RAID management system dynamically alters the RAID level mappings, it also updates the mapping information in the memory map store to reflect the alterations.

The migration operation of memory system 10 will now be described with reference to FIGS. 1 and 4.

For purposes of continuing explanation, virtual blocks 53 of the application-level virtual storage space 50 reference associated allocation blocks 45 in parity RAID area 44 stored in area A1 of physical storage space 34. Such virtual blocks 53 may be referred to as "parity virtual blocks" while the associated allocation blocks 45 are referred to as "parity allocation blocks". Similarly, virtual blocks 52 reference associated allocation blocks 43 in mirror RAID area 42 stored in area A0 of physical storage space 34. Such virtual blocks 52 may be referred to herein as "mirror virtual blocks" while the associated allocation blocks 43 are referred to as "mirror allocation blocks".

In general, to migrate data from one RAID area to another, a virtual block associated with an allocation block of a first RAID level type (such as mirror or Level 1) is selected. Then, an unused allocation block representing a second RAID level type (such as parity or Level 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the mapping 54 of the application-level virtual storage space 50 to the RAID-level virtual storage space 40 is modified and updated to reflect the shift of data. The selected virtual block that was formerly associated with an allocation block of the first RAID level type now references via an updated pointer an allocation block of the second RAID level type which contains the migrated data. Any mapping change occurring during this transaction would be updated in memory map store 21.

The continuing discussion provides a more detailed explanation of migrating data between mirror and parity storage areas according to preferred methods and sequences of this invention. To migrate data from parity to mirror storage, the following sequence is employed:

1. The RAID management system locates an unused mirror allocation block 43 in a mirror RAID area 42.

2. If none can be found, the RAID management system creates a mirror allocation block (discussed below).

3. The RAID management system suspends new storage requests to the virtual block to be migrated.

4. The RAID management system waits until all active data storage requests to the virtual block are completed.

5. The data from the parity allocation block 45 associated with virtual block 53 is read into a temporary memory buffer.

6. The data is then written to the mirror allocation block 43 chosen in step 2.

7. The virtual block table is modified to reference the new location of the data in the mirror allocation block 43.

8. The suspended storage requests are resumed. According to the above procedure, a virtual block 53 in the application-level virtual view 50 migrated from parity to mirror storage. Relative to the intermediate virtual view 40, data has migrated from a parity allocation block 45 in parity RAID area 44 to a mirror allocation block 43 in mirror RAID area 42. In the physical storage space data has moved from area A1 to area A0.

If an unused mirror allocation block cannot be located (step 1 above), the RAID management system tries the following preferred sequence of three techniques. First, the RAID management system will try to locate an unused (and thus undesignated) RAID area, which can be converted to a mirror RAID area without violating the system threshold of unused RAID-level storage that is needed to guarantee that migration can always proceed. If this fails and the system has more than the reserved amount of unused RAID-level storage, the system migrates data within parity storage to collect unused parity allocation blocks into unused RAID areas. If this migration yields an unused RAID area that can be converted to a mirror RAID area as above, then the system converts it to a mirror RAID area. Otherwise, the system alternately migrates data from mirror to parity storage, packs mirror storage, and converts unused RAID-level storage to parity until the system increases unused RAID-level storage sufficiently for the location of an unused mirror allocation block or a conversion of an unused RAID area to a mirror RAID area. Since mirror allocation blocks occupy more physical storage space than parity allocation blocks, this last technique will result in a net increase in the amount of unused RAID-level storage.

The creation/conversion protocol used to locate and establish unused mirror allocation blocks is advantageous because it permits the RAID management system to selectively adjust the memory allocation between parity and mirror areas according to the amount of user data and the size of physical storage space. As data usage and storage capacity vary, the RAID management system employs one or more of the above three techniques to maximize the amount of data held in mirror storage.

The RAID management system attempts to avoid the situation in which a storage request must wait for the space-making sequence to yield an unused mirror allocation block by creating unused RAID areas during idle time. However, in some situations, storage requests may be suspended during the space-making sequence. The RAID management system configures the virtual block storage space in such a way that the virtual space will be smaller than the RAID view. This ensures that a free space equal to at least one RAID area is set aside for migration or other purposes. In this manner, the sequence of techniques will always yield an unused mirror allocation block.

To migrate data from mirror to parity storage, the following sequence is employed:

1. The RAID management system chooses a virtual block from 52 to migrate from mirror to parity storage according to a migration policy such as access recency or access frequency.

2. The RAID management system locates an unused parity allocation block 45 in a parity RAID area 44.

3. If such a block cannot be found, space reserved for migration is converted to a parity RAID area according to the above described creation techniques.

New storage requests to the virtual block to be migrated are suspended.

5. The RAID management system waits until all active storage requests to the virtual block are completed.

6. Data is read from the mirror allocation block 43 associated with virtual block 52 into a temporary memory buffer.

7. The data is written to the chosen parity allocation block 45.

8. The virtual block table is modified to reference the new location of the data in parity allocation block 45.

9. Data requests to the virtual block are resumed. The above two enumerated sequences provide examples of how the memory system of this invention can operate to migrate data between two different levels of redundancy.

When the virtual views are mapped and presented for use by the user, it is desirable that the data storage system not over-commit storage resources that are unavailable. Avoiding over-commitment in this redundant hierarchic data storage system is complicated by the fact that data can be migrated between mirror and parity RAID areas. Accordingly, the data storage system of this invention monitors its storage resources to prevent over-committing the virtual storage spaces to the user.

Figure 5:
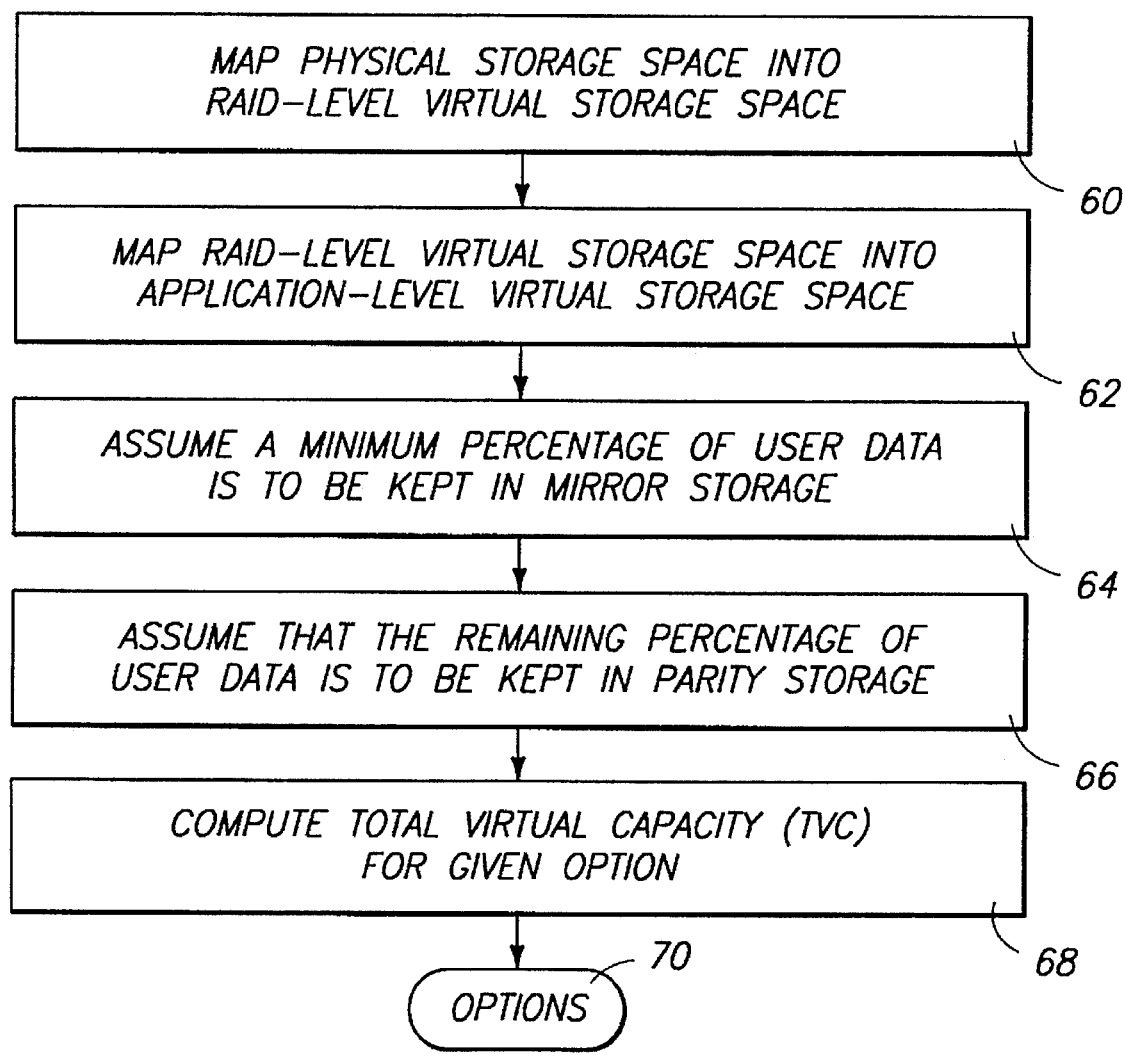
FIG. 5 is a flow diagram of a general method for avoiding over-commitment of virtual storage space according to one aspect of this invention.

FIGS. 5 illustrates a general method for avoiding over-commitment of virtual storage space. This method will be described with reference to FIG. 7 which shows a disk array 90 having eight storage disks 0–7. Briefly, the method derives the total virtual capacity of the application-level storage space that can be committed to a user.

Steps 60 and 62 establishes the RAID-level virtual view 40 and application-level virtual storage space 50 as described above with reference to FIG. 4. In the remaining steps 64–68, the RAID management system computes the maximum capacity available for the application-level virtual storage space given a minimum percentage must be kept in mirror storage. At step 64, the RAID management system assumes that a minimum of the user data is to be kept in mirror storage. An example minimum percentage is 10%. That is, at least 10% of the number of blocks in the application-level virtual storage space are allocated as blocks for mirror storage. The remaining percentage of user data is assumed to be kept in parity RAID areas (step 66). This theoretical 10%/90% division of mirror and parity RAID areas is used for computing the total virtual capacity because it affords a pessimistic assumption that the disk array is at full storage capacity.

Another assumption concerns a theoretical layout of the mirror RAID storage and the parity RAID storage. Specifically, the RAID management system assumes for purposes of computing a total virtual capacity that the mirror RAID areas are mapped into physical disk areas which extend across all storage disks in the array. This is shown in FIG. 7 where the mirror RAID areas are theoretically positioned at the bottom of the disk array. The parity RAID areas are then theoretically placed in the remaining RAID-level virtual view which maps onto the upper and possibly non-uniform portion of the disk array. Example RAID areas RA$_H$, RAH+$_1$, etc, are illustrated as being mapped onto contiguous regions R of storage disks 0–7.

Figure 6:
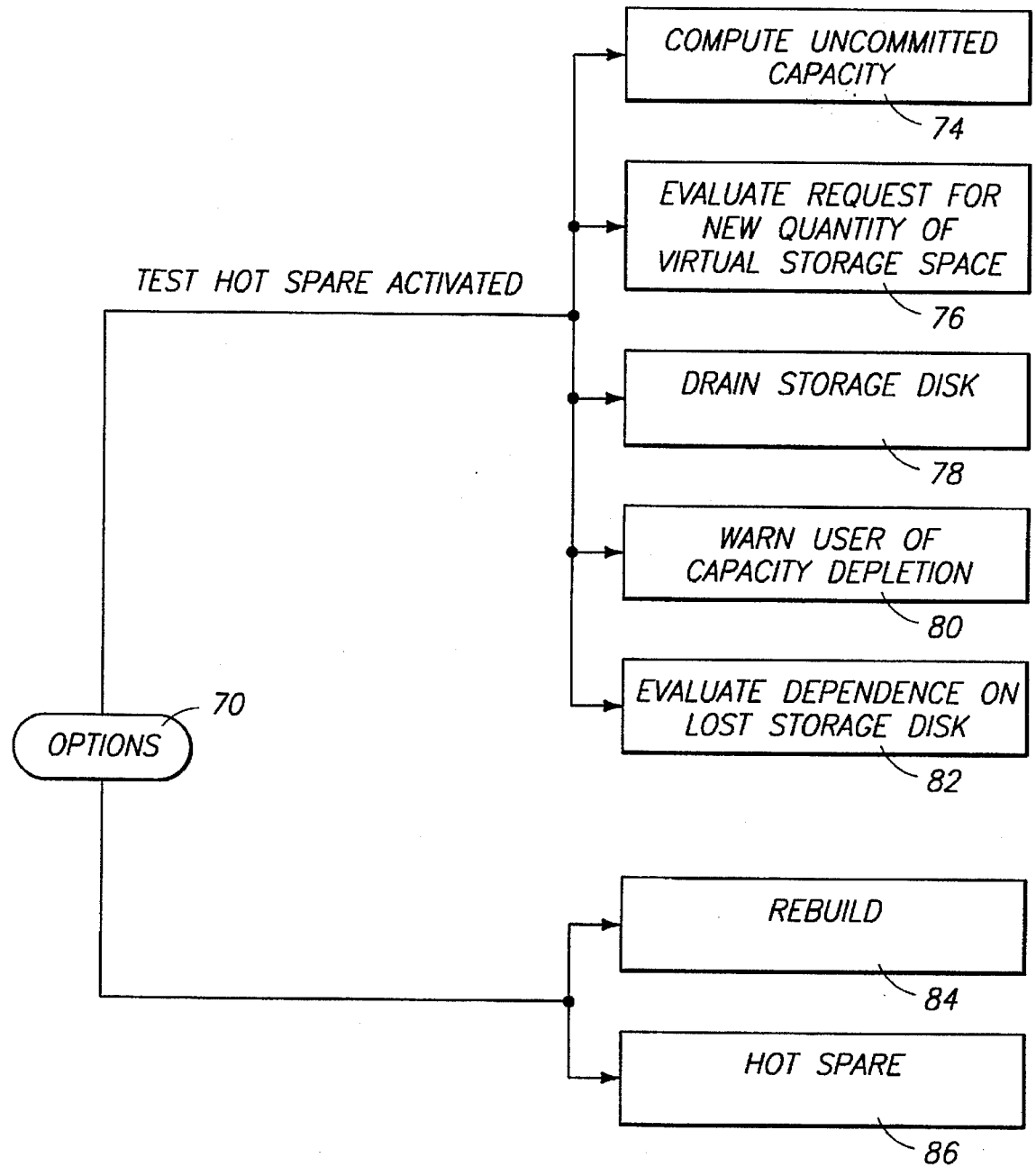
FIG. 6 shows various steps that can be taken subsequent to the general method shown in FIG. 5 to avoid over-commitment.

Once the mirror and parity RAID areas are theoretically separated and placed in the disk array, the RAID management system can compute a total virtual capacity of the application-level virtual storage space that can be committed to a user for a given option (step 68). This computation is based upon the potential quantity of virtual storage space to be consumed by the minimum percentage of mirror RAID areas and the potential quantity of virtual storage space to be consumed by the remaining percentage of parity RAID areas. The total virtual capacity is computed separately and differently according to the various options given as step 70. The calculation may be made without inclusion of the capacity of one or more storage disks in the physical capacity depending upon the desired option selected. Such options include computation of uncommitted capacity, evaluation of a request for a new quantity of virtual storage space, evaluation of whether a storage disk can be drained, monitoring of capacity depletion, and evaluation of whether a disk can be lost without detrimental effect to the system. These determination processes are described below in more detail with respect to FIG. 6.

Figure 8B:
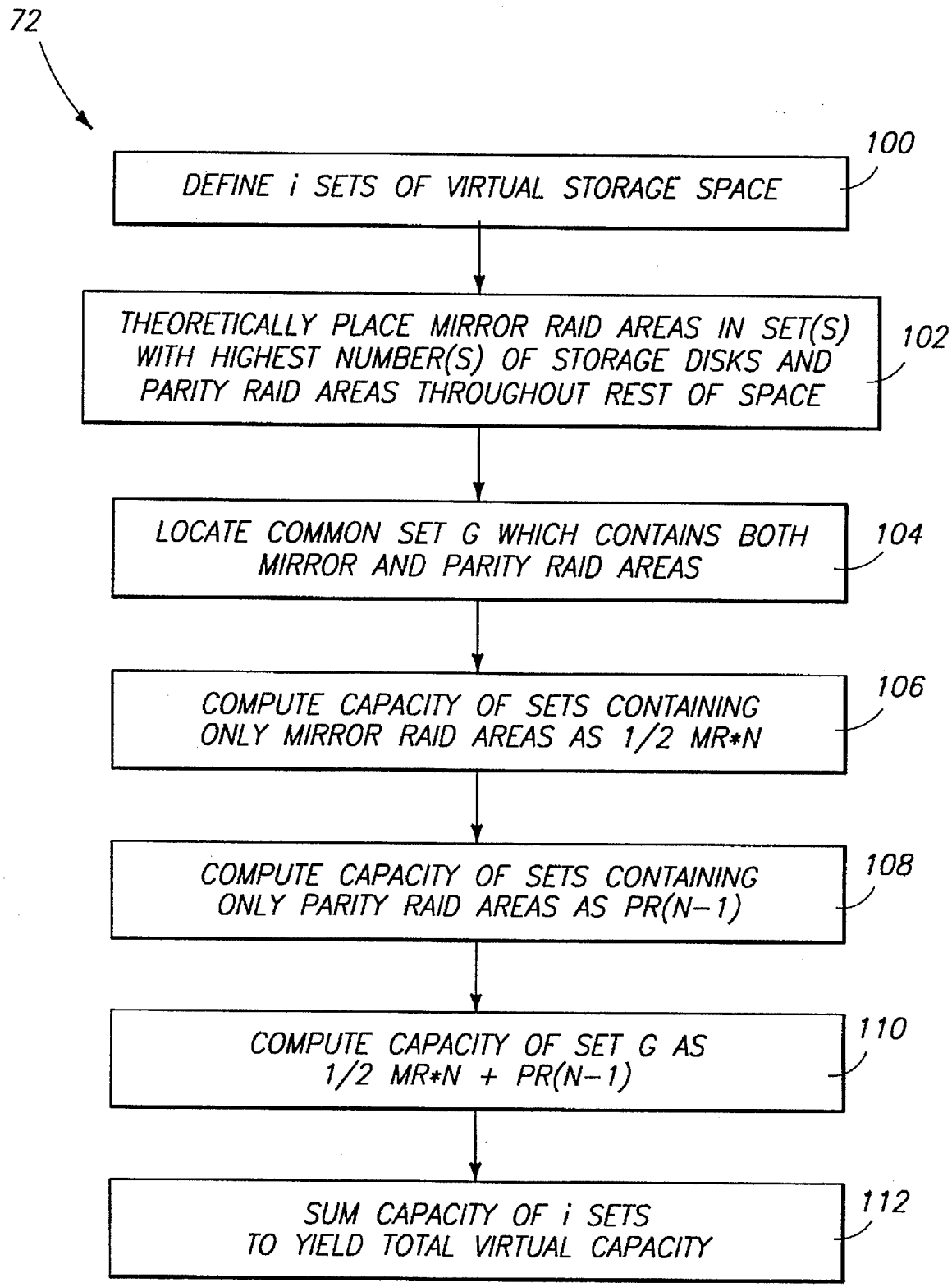
FIG. 8 is a flow diagram of a more detailed method for avoiding over-commitment of virtual storage space according to another aspect of this invention.

Before addressing these options, however, a more detailed discussion of the general computation of the total virtual capacity will be discussed with reference to FIGS. 7 and 8. The RAID management system first defines one or more sets i within RAID-level virtual storage space (step 100). Each set contains a group of RAID areas which extend across the same number of storage disks. In a "homogenous" disk array, where all storage disks are the same size, there will only be one set. All RAID areas are equal in size and extend across all of the equal-sized storage disks. Conversely, in a "heterogenous" disk array, where the storage disks have different sizes, there will be more than one set.

FIG. 7 shows a heterogenous disk array in which disks 0, 2, 3, and 7 are the same size; disks 1, 5, and 6 are the same size, but larger than disks 0, 2, 3, and 7; and disk 4 is the largest disk. In this disk array, three sets can be defined. Set 0 includes the group of RAID areas which map onto all eight storage disks. Set 0 covers the bulk of the memory space. Set 1 includes the group of RAID areas which map onto four disks 1, 4, 5, and 6. Set 2 includes the group of RAID areas that map onto the uppermost portion of disk 4.

The RAID management system theoretically places the mirror RAID areas in one or more sets that contain the group of RAID areas with the highest number of storage disks (step 102). Said another way, the RAID management system assumes for purposes of computing the total virtual capacity that the mirror RAID areas are mapped into the bottom portion of the disk array which spans all storage disks as depicted in FIG. 7. The parity RAID areas are theoretically placed in the remaining RAID-level virtual storage space.

Once the mirror and parity RAID areas are theoretically separated, one of the defined sets will contain both mirror and parity RAID areas. In the heterogenous array of FIG. 7, set 0 is the common set which contains both mirror and parity RAID areas. Typically, set 0 is the largest set and will usually be the common set. In a homogenous disk array, the single set will of course contain both types of RAID areas. However, in odd heterogenous disk arrays having, for example, one small disk and several very large disks, a set other than set 0 will be contain both mirror and parity storage.

The RAID management system locates the common set, designated as G, for a given disk array configuration by solving the following relationship [1] for the smallest G:

$$\sum_{i=0}^{G} VirCapacMirSet(i) \geq \frac{C}{100-C} \sum_{i=G+1}^{K} VirCapacParSet(i)$$

where "VirCapacMirSet" represents the virtual capacity of the mirror RAID areas in set i, "VirCapacParSet" represents the virtual capacity of the parity RAID areas in set i, K represents a total number of sets, and C is the minimum percentage for mirror RAID areas (expressed as a whole number, such as 10 for 10%).

Once common set G has been located, the RAID management system can compute the capacities of the various sets of RAID areas. Since some sets contain either mirror or parity RAID areas, but not both, the computation in these sets is simply a function of either the quantity of virtual storage space consumed by mirror RAID areas (designated as MVT) or the quantity of virtual storage space consumed by parity RAID areas (designated as PVT). Only common set G, which contains both mirror and parity RAID areas, poses a more complicated computation based upon a function of both MVT and PVT. Once the capacities of each set are found, the total virtual capacity for the application-level virtual storage space is simply the sum of these set capacities.

At step 106, the RAID management system computes the capacity of sets containing only mirror RAID areas, if any. The quantity of virtual capacity consumed by mirror RAID areas (MVT) is given by the following equation [2]:

$$MFT = \tfrac{1}{2} MR * N$$

where MR is the number of mirror RAID areas and N is the number of storage disks in the set. In the configuration of FIG. 7, however, there are no sets which contain only mirror RAID areas.

At step 108, the RAID management system computes the capacity of sets containing only parity RAID areas, if any. The quantity of virtual capacity consumed by parity RAID areas (PVT) is given by the following equation [3]:

$$PVT = PR(N-1)$$

where PR is the number of parity RAID areas. In FIG. 7, sets 1 and 2 contain only parity RAID areas, and the capacities of these sets would be determined using this equation.

At step 110, the RAID management system computes the capacity of common set G as a function of both MVT and PVT. This computation is more complicated because the number of mirror RAID areas MR and the number of parity RAID areas PR in set G must first be determined. The number of mirror RAID areas MR is given by the following equation [4]:

$$MR = \frac{2C*V51 + 2C(N-1)L - 2(100-C)V11}{(100-C)N + 2C(N-1)}$$

where V51 represents the RAID 5 virtual capacity in all sets outside of set G (given in a unit of storage equivalent to a region that resides on a single disk within a RAID area), V11 represents the RAID 1 virtual capacity in all sets outside of set G (also given in a unit of storage equivalent to a region that resides on a single disk within a RAID area), N represents the number of disks in set G, and L represents the number of RAID areas in set G. Once the number of mirror RAID areas MR is computed, the number of parity RAID areas PR in set G is computed by equation [5]:

$$PR = G - MR$$

These values for MR and PR are used in equations [2] and [3] above. The quantity of virtual capacity consumed by both mirror and parity RAID areas is thus given by the following equation [6]:

$$\text{Virtual Capacity of Set } G = MVT + PVT = \tfrac{1}{2} MR \ast N + PR(N-1)$$

After the capacities of each set are computed, the total virtual capacity of application-level virtual storage space can be computed as a sum of those capacities (step 112). Specifically, the total virtual capacity TVC is derived according to the following relationship [7]:

$$TVC = [1/2 MR \ast N_G + PR(N_G - 1)]_{inside} + \sum_{s<G}[1/2 MR \ast N_S]_{outside} + \sum_{s>G}[PR(N_S - 1)]_{outside}$$

where the subscript "inside" designates that the mirror and parity RAID areas are located within the common set G. Ns represents the number of disks within set G, $N_s$ represents the number of disks within those sets other than common set G, and the subscript "outside" designates that the mirror and parity RAID areas are located in sets other than the common set G. Two summations are used for sets outside of common set G because those sets on one side of set G, if any, are theoretically assumed to contain only mirror RAID areas and those sets on the other side of set G, if any, are assumed to contain only parity RAID areas.

With reference again to FIG. 5, the total virtual capacity for the application-level virtual storage space can be calculated without including one or more disks in the physical storage space. This supports the options shown in FIG. 6. For some of the options, namely options 74–82, the data storage system determines whether a "hot spare option" is activated by the user. When the "hot spare option" is activated, the data storage system sets aside the capacity of the largest storage disk to be used in the event another storage disk fails. Conventional prior art data storage systems typically designate one whole storage disk as the so-called "hot spare" disk. The hot spare disk is attached to a mechanical bay and the SCSI bus and is fully operable within the disk array, but remains idle until a disk fails. Upon disk failure, the hot spare disk is used to store accessible user data for purposes of disk rebuild.

According to the data storage system of this invention, an amount of storage space equivalent to the capacity of the largest storage disk in the array is distributed over all storage disks in the array. No one storage disk is designated as the "hot spare" disk. All disks in the array store accessible user data. The increased distribution significantly improves performance by increasing parallelism and by providing more capacity for mirror storage.

If the "hot spare option" is activated, the capacity of the physical storage space is reduced by the capacity of the largest storage disk in the disk array for purposes of computing the maximum capacity of the application-level virtual storage space that can be committed to the user. The largest storage disk is used because this ensures that the rebuild process can be performed if any storage disk, including the largest, in the array fails. In a "homogenous" disk array where all storage disks are the same size, the capacity of any storage disk can be used. With reference to FIG. 7, the capacity of storage disk 4 (the largest disk in array 90) would not be available for the maximum capacity of the application-level virtual storage space that can be mapped to the RAID-level virtual storage space. On the other hand, if the "hot spare option" is not activated, the maximum virtual storage space is not reduced by the reservation of the physical capacity of the largest storage disk.

It is further noted that the total virtual capacity can be computed while disregarding the capacity of any storage disk in the system, not just the largest disk. Thus, the disk array storage system can support a number of options with total virtual capacity calculations.

Option 1: Uncommitted Capacity

At step 74, the data storage system computes "uncommitted capacity", the remaining capacity of virtual storage space that is not committed for use by the user. To compute uncommitted capacity, the RAID management system subtracts the committed capacity that has been committed for use by the user from the total virtual capacity. Uncommitted capacity can therefore be represented by the following equation [8]:

---

Uncommitted Capacity =
  if reserving hot spare space,
    TVC without the largest disk device - committed capacity.
  else
    TVC - committed capacity.

---

Notice that if the hot spare option is activated, then the total virtual capacity (TVC) is derived assuming that the capacity of the largest storage disk has been removed from the disk array.

Option 2: Request for New Virtual Storage Space

A user might request to define a new virtual storage space of a given size (step 76). The data storage system approves a request for new virtual storage space if the new space is less than or equal to the difference between the total virtual capacity and the committed capacity. This is the same as saying the request will be approved if the new virtual storage space is less than or equal to the uncommitted capacity. This is given by the following relationship [9]:

---

Approve Request for New Virtual Space iff:
  if reserving hot spare space,
    New space ≤ TVC without largest storage disk - committed capacity
  else
    New space ≤ TVC - committed capacity.

---

Option 3: Request to Drain Storage Disk

A request might be made to drain data from one storage disk (step 78). The "drain" process removes all data from the storage disk and stores it in other locations. Redundancy is regenerated for the new storage configuration on the other disks. The drained storage disk can then be removed from the array. The request for draining a storage disk is approved if the total virtual capacity, without the capacity of storage disk to be drained, and minus the committed capacity is greater than or equal to zero, as represented by relationship [10]:

---

Request to Drain a Storage Disk is Approved iff:
    if reserving hot spare space,
        TVC without capacity of storage disk to be drained and
        without largest storage disk - committed capacity $\geq 0$
    else
        TVC without capacity of storage disk to be drained -
        committed capacity $\geq 0$.

---

Option 4: Warn User of Capacity Depletion

The data storage system uses the total virtual capacity computed in equation [7] in a process for warning a user of capacity depletion (step 80). Initially, a desired threshold ratio of unused virtual storage space to the total virtual capacity (TVC) is set by the user. During operation, an actual ratio of the actual amount of unused virtual storage space to the total virtual capacity is computed and compared to the threshold ratio. If the actual ratio exceeds the threshold ratio, the data storage system informs the user that the capacity of the system has been depleted. If the actual ratio does not exceed the threshold ratio, no warning is given. This option is represented by the following equation [11]:

---

Capacity depleted warning =
    if reserving hot spare space,
        using TVC = TVC without largest storage disk
    else,
        using TVC = TVC:
    (threshold ratio - (unused virtual storage space/TVC)) $\geq 0$.

---

Option 5: Evaluate Whether Committed Capacity Depends on Missing Storage Disk At step 82, another option following determination of the total virtual capacity computed in equation [7] is to determine whether the capacity committed to the user depends upon a missing storage disk. Such a situation arises when a user has added a new storage disk, but the system has not yet allocated RAID-level virtual storage space which includes the new storage disk space. The storage disk could be removed without affecting the committed capacity already allocated to the user.

The system evaluates whether a disk can be removed without affecting the existing committed capacity by the following relationship [12]:

---

Committed Capacity depends on Storage Disk iff:
    if reserving hot spare space,
        TVC without capacity of missing storage disk and without
        largest storage disk - committed capacity < 0
    else
        TVC without capacity of missing storage disk -
        committed capacity < 0.

---

Option 6: Disk Rebuild

Another option is to determine if there is sufficient capacity to rebuild a storage disk in the event one storage disk fails (step 84). With respect to disk rebuild, there exists sufficient capacity to permit a storage disk rebuild if the total virtual capacity reduced by the committed capacity is greater than or equal to zero. At this point, the storage disk has failed and thus, the capacity of the failed storage disk will not be part of the physical capacity and therefore not part of the total virtual capacity (TVC) calculation. This can be represented by the following relationship [13]:

---

Approve Disk Rebuild iff: TVC–committed capacity$\geq 0$.

---

Option 7: Activation of Hot Spare

A request to activate the hot spare option might occur after the user has already stored data in the system. There exists sufficient space to accommodate the hot spare option if the total virtual capacity (calculated without the capacity of the largest storage disk), minus the committed capacity, is greater than or equal to zero. This formula is the same as checking whether uncommitted capacity derived in equation [8] under the assumption that the hot spare option is activated (i.e., to calculate the total virtual capacity TVC without the capacity of the largest storage disk) is greater than zero. The hot sparing request can be represented by the following relation [14]:

---

Approve Request for Hot Spare iff:
    TVC without capacity of largest storage disk - committed
    capacity $\geq 0$.

---

The options described above represent possible uses of the total virtual capacity value derived in equations [1–7]. Other uses are also possible. By recalculating the total virtual capacity specifically for each option, the data management system of this invention effectively avoids overcommitment of resources because each request can be analyzed based upon the dependence of the option on disk capacities and committed capacity.

FIG. 9 shows a method for operating a redundant hierarchic data storage system according to another aspect of this invention. This method examines whether more mirror allocation blocks can be allocated in view of the existing storage configuration and work load demands. Step 120 establishes the RAID-level virtual storage space which is described above in detail with reference to FIG. 4. At step 122, the RAID management system reserves storage space in a non-contiguous manner throughout the RAID-level virtual storage space. That is, the RAID management system ensures that an amount of unused space distributed throughout the virtual storage space (in both mirror and parity storage areas) is reserved. Upon receiving a request to allocate a new mirror allocation or parity allocation block (step 124), the RAID management system examines the RAID areas to identify any unused allocation blocks (step 126). Unused allocation blocks are storage blocks within the RAID-level virtual storage space that have not yet been allocated.

At step 128, the unused allocation blocks are counted. Recall from equations [2] and [3], more data can be stored in parity RAID areas as compared to mirror RAID areas, given the same amount of virtual storage space. Accordingly, the RAID management system begins looping through the RAID areas (mirror, parity, and undesignated) and counts the allocation blocks according to their presently allocated state of mirror or parity. For undesignated RAID areas, all of the allocation blocks within such undesignated RAID areas are assumed to be unused parity allocation blocks for purposes of the computation.

If during the counting process the count of unused allocation blocks becomes greater than or equal to the amount of reserved storage space (i.e., the "yes" branch from step 130), the RAID management system immediately allows the request to allocate the new allocation block (step 132) and stops counting. On the other hand, if the count of unused allocation blocks is less than the amount of reserved storage space following an entire sweep through the RAID-level virtual storage space (i.e., the "no" branch from step 130), the RAID management system will deny the request to allocate the new allocation block (step 134).

In some circumstances, the RAID management system might receive a request that results in a conversion of an undesignated RAID area to a new mirror RAID area of a selected size. This happens when no unused mirror allocation blocks could be found. Upon such are request, the RAID management system derives a maximum allowable size of a mirror RAID area as a function of the number of unused allocation blocks (step 128), the reserved storage space (expressed in allocation blocks), and the number of allocation blocks provided per region of physical storage space. An example value for this latter variable is sixteen as sixteen 64K allocation blocks can be mapped into a 1M region. More specifically, the maximum allowable size of a mirror RAID area (MRA_max) is given by the following equation [15]:

$$MRA\_max = (2*diff/AB\_per\_region) + 2$$

where "diff" represents the difference between the number of unused allocation blocks and the reserved storage space, and "AB_per_region" represents the number of allocation blocks per region of physical storage space.

The request will be allowed if the size of the new mirror RAID area is less than or equal to the maximum allowable size.

This invention has many benefits. First, it provides a straightforward approach to avoiding over-commitment of virtual storage space to a user. This is done by limiting committed capacity below the total virtual capacity available to the user by the following combined amount: (1) at least one RAID area reserved for migration, (2) the space required to ensure that at least a minimum amount of user data can be kept in mirror storage, and (3) the capacity of the largest storage disk in the event that the "hot spare" option is enabled. Second, many other requests for more storage can be screened to determine whether the request can be satisfied without certain disk capacities. Third, this invention evaluates requests for more mirror RAID areas and denies such requests if the system is unable to accommodate more mirror RAID areas.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for avoiding over-commitment of virtual storage space in a hierarchic data storage system; the data storage system comprising a disk array of multiple storage disks of selected capacities that define a physical storage space of a total physical capacity, the physical storage space being mapped into a RAID-level virtual storage space which presents the physical storage space as multiple RAID areas, the RAID areas including mirror RAID areas which store data according to mirror redundancy and parity RAID areas which store data according to parity redundancy, the RAID-level virtual storage space being mapped into an application-level storage space; the method comprising the following steps:

mapping the RAID-level virtual storage space into an application-level storage space;

providing for a minimum percentage of user data to be kept in the mirror RAID areas;

providing for a remaining percentage of user data to be kept in parity RAID areas; and computing a total virtual capacity of the application-level virtual storage space that can be committed to a user based upon the provision for the minimum percentage of user data to be kept in mirror RAID areas and the remaining percentage of user data to be kept in parity RAID areas.

2. A method according to claim 1 further comprising the following additional steps:

providing a hot spare option where a quantity of the RAID-level virtual storage space is reserved for disk sparing space;

detecting whether the user has activated the hot spare option; and in the event the hot spare option is activated, computing the total virtual capacity of the application-level virtual storage space without including a capacity of a largest size storage disk.

3. A method according to claim 1 further comprising the following additional steps:

providing a committed capacity of the application-level virtual storage space that has been committed for use by the user; and computing an uncommitted capacity that has not been committed for use by the user by subtracting the committed capacity from the result of the total virtual capacity computation.

4. A method according to claim 1 further comprising the following additional steps:

providing a committed capacity of the application-level virtual storage space that has been committed for use by the user;

in the event that a storage disk fails, the computing step comprises computing the total virtual capacity without including a capacity of a failed storage disk; and determining whether there is sufficient capacity to permit rebuild of the failed storage disk by evaluating whether the total virtual capacity computed without including the capacity of the failed storage disk is greater than or equal to the committed capacity.

5. A method according to claim 1 further comprising the following additional steps:

providing a hot spare option where a quantity of the RAID-level virtual storage space is reserved for disk sparing space;

providing a committed capacity of the application-level virtual storage space that has been committed for use by the user;

in the event that a user requests to activate a hot spare option, the computing step comprises computing the total virtual capacity without including a capacity of a failed storage disk; and approving the request to activate the hot spare option if the total virtual capacity computed without including the capacity of the failed storage disk is greater than or equal to the committed capacity.

6. A method according to claim 1 further comprising the following additional steps:

providing a committed capacity of the application-level virtual storage space that has been committed for use by the user;

receiving a request from the user to add a new quantity of application-level virtual storage space;

evaluating whether the new quantity of application-level virtual storage space can be committed to the user based upon the result of the total virtual capacity computation, the committed capacity, and the requested new quantity of application-level virtual storage space; and approving commitment of the requested new quantity of application-level virtual storage space to the user if the requested new quantity is less than a difference between the total virtual capacity and the committed capacity.

7. A method according to claim 1 further comprising the following additional steps:

providing a committed capacity of the application-level virtual storage space that has been committed for use by the user; and evaluating whether the storage capacity of one storage disk can be lost without compromising the committed capacity to the user, the evaluation being based upon the result of the total virtual capacity computation, the committed capacity, and the capacity of the one storage disk.

8. A method according to claim 1 further comprising the following additional steps:

setting a desired threshold ratio of unused application-level virtual storage space to the result of the total virtual capacity computation;

determining an actual ratio of an actual amount of unused application-level virtual storage space to the result of the total virtual capacity computation; and informing the user that capacity of the application-level virtual storage space is depleted if the actual ratio exceeds the threshold ratio.

9. A method according to claim 1 further comprising the following additional steps:

reserving a selected quantity of RAID-level virtual storage space; and migrating data between the mirror and parity RAID areas using the reserved virtual storage space.

10. A method for avoiding over-commitment of virtual storage space in a hierarchic data storage system; the data storage system comprising a disk array of N storage disks of selected capacities that define a physical storage space of a total physical capacity; the method comprising the following steps:

(a) mapping the physical storage space into a RAID-level virtual storage space which presents the physical storage space as multiple RAID areas, individual RAID areas extending across multiple storage disks, the RAID areas including a number of mirror RAID areas (MR) which store data according to mirror redundancy and a number of parity RAID areas (PR) which store data according to parity redundancy, the mirror RAID areas consuming a quantity of RAID-level virtual storage space (MVT) equal to ½MR*N, the parity RAID areas consuming a quantity of RAID-level virtual storage space (PVT) equal to PR(N-1);

(b) providing for a minimum percentage of user data to be kept in the mirror RAID areas (MR);

(c) defining one or more sets of RAID-level virtual storage space, individual sets comprising a group of RAID areas which extend across the same number of storage disks;

(d) assuming that the mirror RAID areas (MR) reside in one or more sets that contain the group of RAID areas with a highest number of storage disks;

(e) assuming that the parity RAID areas (PR) reside in the remaining RAID-level virtual storage space;

(f) locating the set which contains both the mirror RAID areas and the parity RAID areas;

(g) computing a capacity of the RAID-level virtual storage space of the set located in step (f) as a function of both MVT and PVT;

(h) computing a capacity of the RAID-level virtual storage space of any set other than the set located in step (f) as a function of one of MVT or PVT; and (i) summing the capacities of the RAID-level virtual storage spaces for each set computed in steps (g) and (h) to yield a total virtual capacity.

11. A method according to claim 10 further comprising the following additional steps:

providing a hot spare option where a quantity of the RAID-level virtual storage space is reserved for disk sparing space;

detecting whether the user has activated the hot spare option; and in the event the hot spare option is activated, computing the total virtual capacity of the application-level virtual storage space without including a capacity of a largest size storage disk.

12. A method according to claim 10 further comprising the following additional steps:

mapping the RAID-level virtual storage space into an application-level virtual storage space;

providing a committed capacity of the application-level virtual storage space that has been committed for use by the user; and computing an uncommitted capacity that has not been committed for use by the user by subtracting the committed capacity from the result of the total virtual capacity computation.

13. A method according to claim 10 further comprising the following additional steps:

reserving a selected quantity of RAID-level virtual storage space; and migrating data between the mirror and parity RAID areas using the reserved virtual storage space.

14. A method for operating a hierarchic data storage system; the data storage system comprising a disk array of multiple storage disks of selected capacities that define a physical storage space of a total physical capacity; the method comprising the following steps:

(a) mapping the physical storage space into a RAID-level virtual storage space which presents the physical storage space as multiple RAID areas, the RAID areas including mirror RAID areas which contain mirror allocation blocks to store data according to mirror redundancy and parity RAID areas which contain parity allocation blocks to store data according to parity redundancy, individual RAID areas extending across multiple storage disks and being associated with a region from individual storage disks, the RAID-level virtual storage space also having unused allocation blocks;

(b) providing reserved storage space in a non-contiguous manner throughout the RAID-level virtual storage space;

(c) receiving a request to allocate a new allocation block as one of a mirror allocation block or a parity allocation block;

(d) examining individual RAID areas to identify any unused allocation blocks;

(e) counting a number of unused allocation blocks; and (f) allowing the request to allocate a new allocation block if the number of unused allocation blocks is greater than or equal to the reserved storage space.

15. A method according to claim 14 wherein the allocation blocks having a size such that multiple allocation blocks can correlate to one region of the physical storage space and the step (c) of receiving a request comprises receiving a request to convert an undesignated RAID area to a new mirror RAID area of a selected size;

the method further comprising the following additional steps:

(g) deriving a maximum allowable size of a mirror RAID area as a function of the number of unused allocation blocks, the reserved storage space, and a number of allocation blocks per region; and (h) allowing the request to convert the undesignated RAID area to a new mirror RAID area if its selected size is less than or equal to the maximum allowable size.

16. A hierarchic data storage system comprising:

a disk array having a number of storage disks that define a physical storage space;

a disk array controller coupled to the disk array for coordinating data transfer to and from the disks;

a RAID management system operatively coupled to the disk array controller for mapping a RAID-level virtual storage space onto the physical storage space of the storage disks; the RAID-level virtual storage space presenting the physical storage space as multiple RAID areas, individual RAID areas extending across multiple storage disks, the RAID areas including mirror RAID areas which store data according to mirror redundancy and parity RAID areas which store data according to parity redundancy; the RAID management system providing for a minimum percentage of user data to be kept in the mirror RAID areas and for a remaining percentage of user data to be kept in parity RAID areas;

the RAID management system mapping the RAID-level virtual storage space into an application-level storage space presented to a user; and the RAID management system computing a total virtual capacity of the application-level virtual storage space that can be committed to a user based upon the provision for the minimum percentage of user data to be kept in the mirror RAID areas and for the remaining percentage of user data to be kept in the parity RAID areas.

17. A hierarchic data storage system according to claim 16 wherein:

the RAID management system defines one or more sets of RAID-level virtual storage space, individual sets comprising a group of RAID areas which extend across the same number of storage disks;

the RAID management system assumes that the mirror RAID areas reside in one or more sets that contain the group of RAID areas with a highest number of storage disks and that the parity RAID areas reside in the remaining RAID-level virtual storage space, where one common set contains both mirror and parity RAID areas; and the RAID management system computes the total virtual capacity TVC according to the following relationship:

$$TVC = [1/2MR*N_G + PR(N_G - 1)]_{inside} + \sum_{s<G} [1/2MR*N_S]_{outside} + \sum_{s>G} [PR(N_S - 1)]_{outside}$$

where MR represents the number of mirror RAID areas, PR represents the number of parity RAID areas, NG represents a number of storage disks within the common set, NS represents a number of storage disks within a set other than the common set, the subscript "inside" designates that the mirror and parity RAID areas are located within the common set, and the subscript "outside" designates that the mirror and parity RAID areas are located in sets other than the common set.

18. A hierarchic data storage system according to claim 16 wherein:

the RAID management system defines one or more sets of RAID-level virtual storage space, individual sets comprising a group of RAID areas which extend across the same number of storage disks;

the RAID management system assumes that the mirror RAID areas reside in one or more sets i that contain the group of RAID areas with a highest number of storage disks and that the parity RAID areas reside in the remaining RAID-level virtual storage space, where one common set G contains both mirror and parity RAID areas; and the RAID management system locates the common set G which is the smallest G that satisfies the following relationship:

$$\sum_{i=0}^{G} VirCapacMirSet(i) \geq \frac{C}{100-C} \sum_{i=G+1}^{K} VirCapacParSet(i)$$

where "VirCapacMirSet" represents the virtual capacity of the mirror RAID areas in set i, "VirCapacParSet" represents the virtual capacity of the parity RAID areas in set i, K represents a total number of sets, and C represents the minimum percentage of mirror RAID areas.

19. A hierarchic data storage system according to claim 16 wherein:

the RAID management system sets aside a quantity of the RAID-level virtual storage space for disk sparing space when a hot spare option is enabled; and if the hot spare option is enabled, the RAID management system computes a total virtual capacity of the application-level virtual storage space that can be committed to a user without including a capacity of a largest size storage disk in the disk array.

20. A hierarchic data storage system according to claim 16 wherein the RAID management system computes the total virtual capacity without including a capacity of at least one of the storage disks in the physical storage space.

21. A computer-readable medium having computer-executable instructions for performing the steps in the method recited in claim 1.

22. A computer-readable medium having computer-executable instructions for performing the steps in the method recited in claim 10.

23. A computer-readable medium having computer-executable instructions for performing the steps in the method recited in claim 14.

* * * * *